US 7,002,447 B2

(12) United States Patent
Dedert et al.

(10) Patent No.: US 7,002,447 B2
(45) Date of Patent: Feb. 21, 2006

(54) FUEL TANK RESISTOR CARD HAVING IMPROVED CORROSION RESISTANCE

(75) Inventors: Ronald Dedert, Geneva, IN (US);
Robert Heimann, Berne, IN (US);
Craig Hoffman, Decatur, IN (US);
Kevin Kurtz, Fort Wayne, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/951,003

(22) Filed: Sep. 27, 2004

(65) Prior Publication Data

US 2005/0040929 A1 Feb. 24, 2005

Related U.S. Application Data

(62) Division of application No. 10/406,356, filed on Apr. 3, 2003, now Pat. No. 6,828,898.

(51) Int. Cl.
*H01C 10/38* (2006.01)

(52) U.S. Cl. .................... 338/190; 338/33; 338/194

(58) Field of Classification Search ............... 338/309, 338/33, 176, 162, 190, 194
See application file for complete search history.

(56) References Cited

U.S. PATENT DOCUMENTS

| | | | | |
|---|---|---|---|---|
| 4,430,172 A | * | 2/1984 | Brugger et al. | 205/257 |
| 5,689,227 A | * | 11/1997 | Nguyen et al. | 338/308 |
| 5,746,088 A | * | 5/1998 | Sawert et al. | 73/317 |
| 6,127,916 A | * | 10/2000 | Cooper et al. | 338/162 |
| 6,518,873 B1 | * | 2/2003 | O'Regan et al. | 338/190 |
| 6,681,628 B1 | * | 1/2004 | Sawert et al. | 73/317 |
| 6,824,597 B1 | * | 11/2004 | Heber et al. | 106/1.22 |

* cited by examiner

*Primary Examiner*—Karl D. Easthom
(74) *Attorney, Agent, or Firm*—Mark P. Bourgeois

(57) ABSTRACT

A resistor card for a fuel level sensor has improved resistance to corrosion and wear. The resistor card has a substrate with a resistive layer and a conductive layer. A nickel layer covers the conductive layer. A nickel-gold alloy layer covers the nickel layer. The nickel-gold alloy layer protects the conductive layer from sulfur corrosion and improves wear resistance.

7 Claims, 6 Drawing Sheets

| PLATING ALLOY | SUPPLIER | COMPOSITION | | HARDNESS (KNOOP) | TYPICAL THICKNESS (MICRO-INCHES) | BASE LAYER | GRAIN SIZE | THERMAL STABILITY | POROSITY INDEX | TRADE NAMES |
|---|---|---|---|---|---|---|---|---|---|---|
| Pd/Ni | PRECIOUS METALS PLATING CO. | 80% Pd | 20% Ni | 390 | | NICKEL | 60-2000 | <450 | 0.7 | PALLNIC |
| | AMERICAN GALVANO | 80% Pd | 20% Ni | 250-300 | | NICKEL | | | | PALLADIN 800 |
| | ENGLEHARD-CLAL | 80% Pd | 20% Ni | 250-300 | | NICKEL | | | | UNION-520 |
| | SHARRETTS PLATING | 80% Pd | 20% Ni | 250-300 | | NICKEL | | | | |
| Pd/Co | RIKA DENSHI | 70% Pd | 30% Co | 500-600 | | | 50-220 | 380 | 0.2-0.4 | PALLADIN 900 |
| | | | | | | | | | | |
| Au/Ni | ENTHONE | 99.70% | 0.30% | 220-300 | 8-50 | NICKEL | 200-250 | 150 | 3.7 | ENGOLD |
| | ENTHONE | 99.90% | 0.10% | 120-180 | | NICKEL | | | | |
| | ENTHONE | 99.00% | 1.0% | 165-205 | | NICKEL | | | | AUTRONEX |
| Au/Co | SHIPLEY-RONAL | 99.7% Au | 0.3% Co | 200 | | | 200-250 | 150 | 3.5 | AURUNA |
| | ENTHONE | 99.9% Au | 0.1% Co | 140 | | | | | | |
| Pt/Ni | | 95% Pt | 5% Ni | 400 | | | | | | |
| Pt/Ir | J&S ELECTROPLATING | 90% Pt | 10% Ir | | | | | | | |
| Pd/Ru | | | | | | | | | | |
| Pt/Co | | | | | | | | | | |
| Pt/Ru | | | | | | | | | | |

FIG. 6

FUEL TANK RESISTOR CARD HAVING IMPROVED CORROSION RESISTANCE

CROSS REFERENCE TO RELATED AND CO-PENDING APPLICATIONS

The present application is a division of U.S. patent application Ser. No. 10/406,356, filed on Apr. 3, 2003, now U.S. Pat No. 6,828,898 and entitled, "Fuel Tank Resistor Card Having Improved Corrosion Resistance". The contents of which are herein incorporated by reference in entirety.

BACKGROUND OF THE INVENTION

1. Field of the Invention

The present invention relates to variable resistors and in particular to a ceramic resistor card for use in a fuel level sensor that is lower in cost and has improved resistance to sulfur corrosion.

2. Description of the Related Art

Variable resistors are known for sensing parameters in a variety of applications. For example, the fuel level in an automobile tank is typically measured using a variable resistor having a sweep arm mechanically or electrically coupled to a float located in a fuel tank. The sweep arm position varies according to the float level. The position of the sweep arm can be detected by measuring the voltage across the variable resistor. Therefore, the voltage detected across the variable resistor is an indication of fuel level.

Examples of such fuel sensors are disclosed in the following U.S. Pat. Nos. 5,746,088, 6,021,668, 6,127,916, 6,212,950 and U.S. Patent publication No. 2002/0040597.

Variable resistors used for fuel level measurement are typically a card with metalized conductor areas and thick film resistive ink. The thick film ink is deposited in precise areas to interconnect specific metallized areas. A sweep arm is pivotally mounted to the patterned card and includes a wiper blade like assembly with contact fingers. As the float raises and lowers according to the fluid level, the wiper contact fingers move along the resistor card in an arcuate path and make contact with the metalized areas. This results in a voltage change that generates a signal representative of the amount of fuel contained in the tank.

One problem with this type of system is that over the life of a vehicle the assembly must go through thousands of cycles in a harsh environment. The card is exposed to both wet and dry conditions as the fluid level is decreased. In addition, the assembly is exposed to severe vibration resulting from vehicle movement. Wear occurs as the wiper contact fingers go back and forth over the metalizations. The electrical resistance of the metalization portions may increase and cause accuracy problems with the fuel reading. Additionally, the metalized portions may wear to the point that an open circuit is created on the card.

The resistor card is manufactured by using a ceramic substrate that is screen printed with conductive and resistive inks and fired at high temperatures in a furnace. Conductive inks used in the manufacturing of the ceramic card contain both various metals and binders. Metals used in the conductive inks include silver, platinum, palladium, gold, copper, as well as others. Silver is desired for conductive properties, low cost and the ease with which electrical wires can be soldered to the substrate. Other metals such as palladium are used in the ink to provide strength against shear forces exerted by the sliding contacts and corrosion resistance. A commonly used conductor is 2.3 parts silver to 1 part palladium by weight.

Silver has many desirable properties as a conductor. Unfortunately, silver is also chemically reactive to compounds found in fuels. For example, sulfur in fuel can attack silver to form various compounds such as silver sulfide (Ag2S), which are non-conductive. These deposits of non-conductive material generate contact resistance and create shifts and/or spikes in the output signal of the fuel sensor. This increased contact resistance may appear as signal "noise" where the output "spikes" momentarily from the proper reading.

One method to improve the corrosion resistance of the resistor card is to increase the amount of gold, palladium or platinum used in the conductive metallization and decrease the amount of silver. Unfortunately, the cost of gold, palladium and platinum is about 100 times greater than the cost of silver. This results in a resistor card that is prohibitively expensive.

A current unmet need exists for a fuel tank resistor card that is both resistant to chemical attack and corrosion and that is cost effective to manufacture.

SUMMARY OF THE INVENTION

It is a feature of the present invention to provide a resistor card for a fuel level sensor that has improved resistance to corrosion and wear.

It is a feature of the present invention to provide a resistor card for a fuel level indicator system. The resistor card has a substrate that has a first and a second surface. A resistive layer is disposed on the first surface. A conductive layer is disposed on the first surface. A nickel layer covers the conductive layer. An alloy layer covers the nickel layer. The alloy layer protects the conductive layer from corrosion.

Another feature of the present invention is to provide a resistor card for a fuel sensor. The resistor card has a ceramic substrate with a first and second surface. A resistive path is located on the first surface. A conductive path is located on the first surface. A barrier layer is located over the conductive path. The barrier layer seals the conductive path from corrosion. An electroplated alloy layer is located over the barrier layer. The alloy layer provides a long lasting wear surface.

BRIEF DESCRIPTION OF THE DRAWINGS

FIG. 6 is a table of compositions for the alloy layer of the present invention.

It is noted that the drawings of the invention are not to scale. In the drawings, like numbering represents like elements between the drawings.

DETAILED DESCRIPTION

Figure 1:
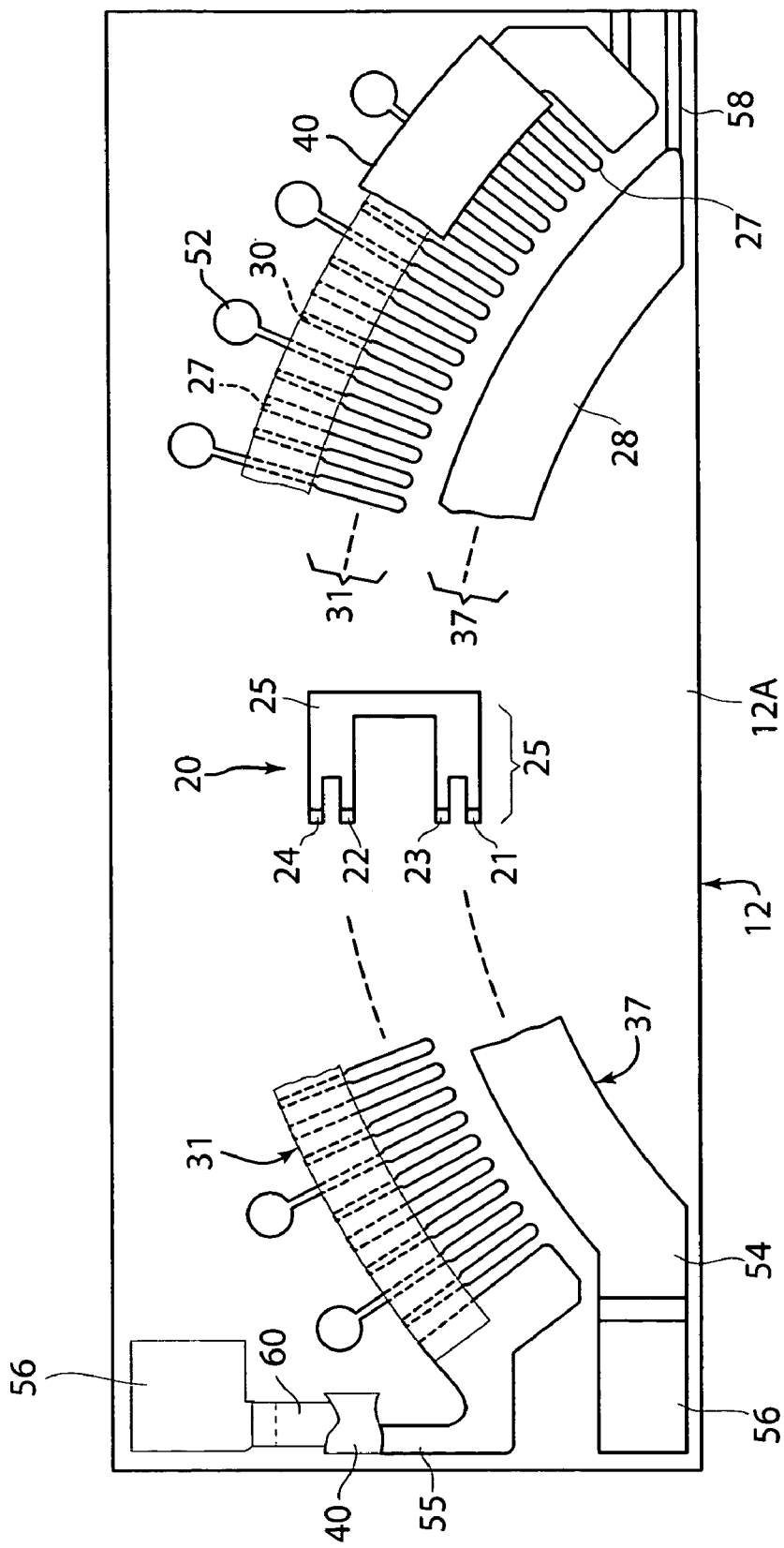
FIG. 1 is a top view of a resistor card and wiper with a portion of the contact portion broken away.
Figure 2:
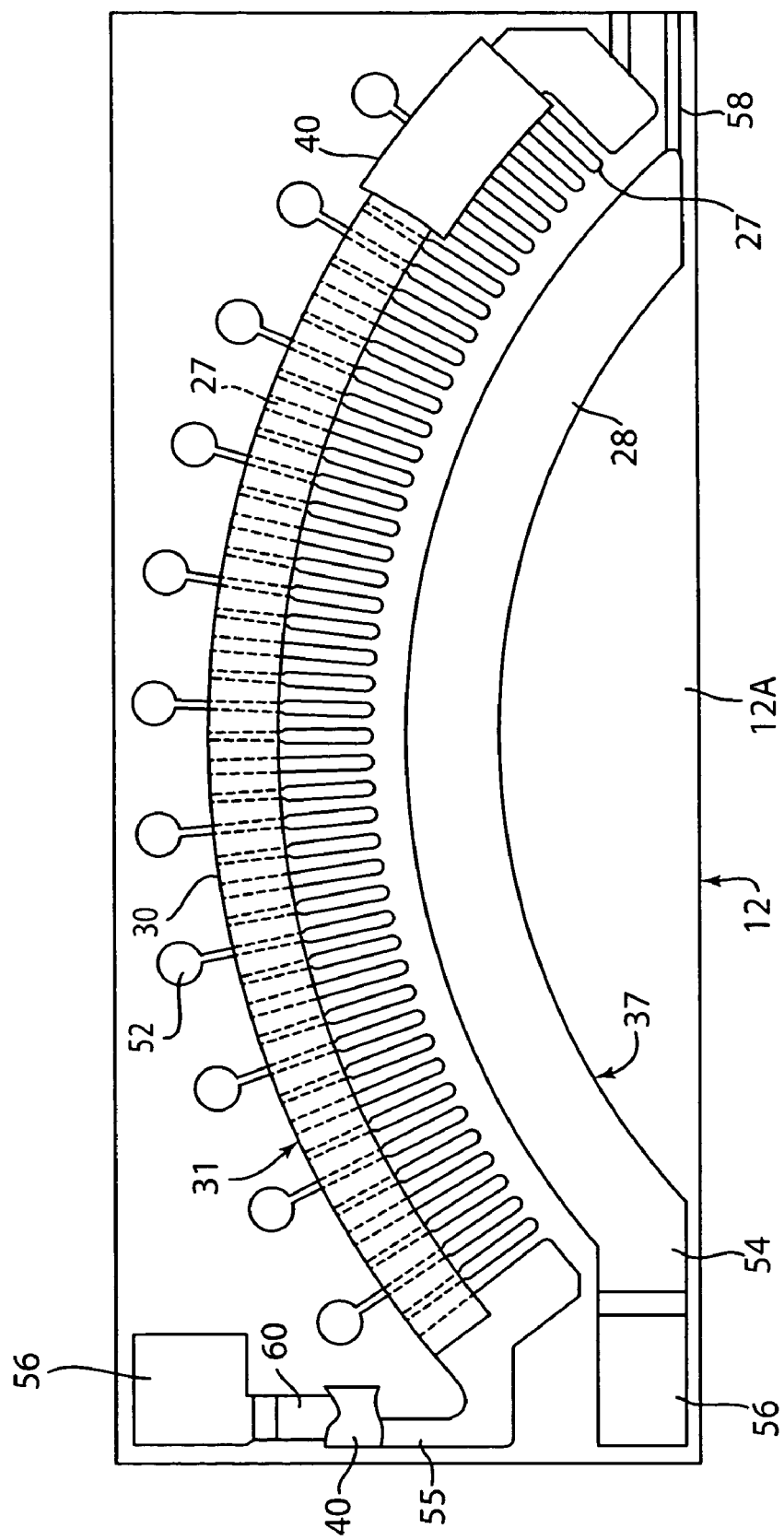
FIG. 2 is a top view of the resistor card of FIG. 1 showing the complete contact pattern.
Figure 3:
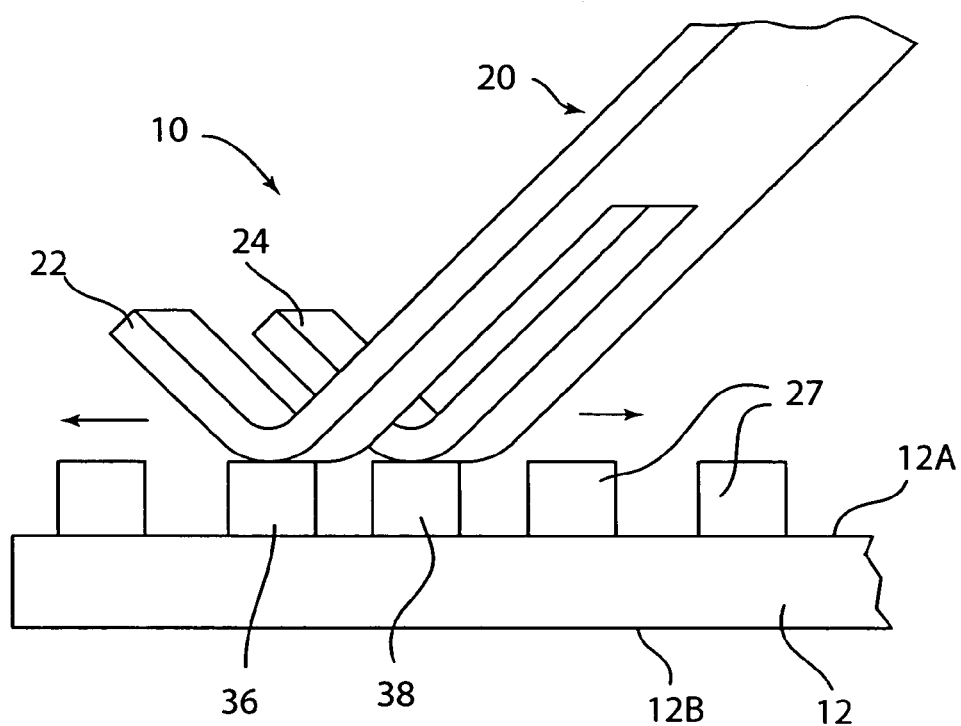
FIG. 3 is a simplified side view of a portion of the resistor card of FIG. 1 in contact with a wiper arm.

Referring to FIGS. 1–4, a fuel level detecting system or sensor 10 is shown. Fuel sensor 10 includes a ceramic resistor card or substrate 12 that is patterned with resistive 31 and conductive 37 paths that are adapted to contact a wiper blade 20. Wiper blade 20 is coupled to a pivoting wiper linkage and a fuel tank float (not shown). Wiper blade 20 has two wiper arms 25. Each arm 25 has conductive fingers 21 and 23, and 22 and 24, which are parallel to each other. Wiper blade 20 is preferably formed from a metal alloy of palladium.

A ceramic substrate 12 is the base for mounting resistive and conductive paths or traces. Substrate 12 has a top surface 12A and a bottom surface 12B. An arc-shaped resistor path 31 and an arc-shaped continuous conductor path 37 are located on surface 12A. The resistor path 31 includes a resistor trace 30 that is located on top of a portion of a conductor line 27 to form a generally arc shaped resistive path 31. The resistor trace 30 overlays a portion of fingers 27. The resistor trace 30 is covered by a glass encapsulant 40. Conductor base 28 forms a generally arc shaped conductor path 37. Fingers 22 and 24 are positioned to contact conductor lines 27 and fingers 21 and 23 are positioned to contact conductor base 28 as the wiper blade 20 moves. The conductors are formed from a thick film conductor material that is a mixture of fine metal particles and a glass frit. The metal particles are in a ratio of 1 part platinum and 99 parts silver. The high ratio of silver gives the conductor very low resistance.

In the fuel tank, as the float rises and lowers the wiper blade 20 arcuately travels across conductor line 27 and conductor base 28. The moving wiper blade 20 is designed and oriented to have a make-before-break operation, in which the sweeping fingers, i.e. 22 and 24 in FIG. 1, make connection with successive adjacent conductor lines 38 before breaking contact with a currently contacted conductor line 36.

Probe pads 52 may be located on substrate 12 for testing during manufacturing. Buss bar 54 connects the conductor base 28 to a terminal pad 56. A wire (not shown) would be soldered to terminal pad 56 in order to make an electrical connection to the resistor card. Similarly, a buss bar 55 connects the resistor trace 30 to another terminal 56. A second resistor 60 can be placed in series with the resistor trace 30. Resistor 60 would be laser trimmed during manufacturing in order to adjust the overall resistance of the resistor card. Resistor 60 is covered by a glass encapsulant 40. Buss bars 58 are connected to resistor 30 and conductor 28 in order to facilitate the electroplating operation during manufacturing.

Figure 4:
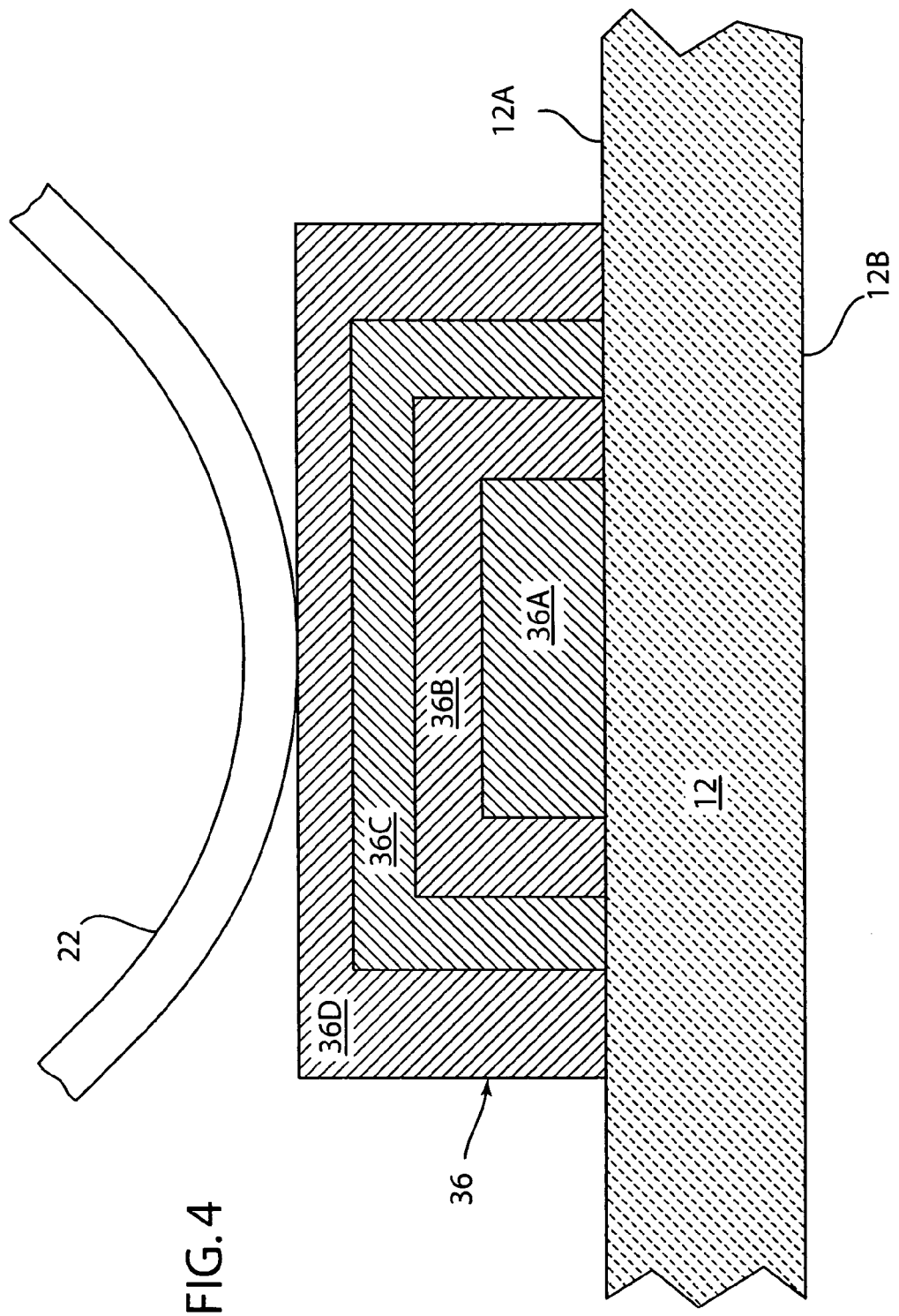
FIG. 4 is a simplified enlarged cross-sectional view of a portion of a conductor of FIG. 1.

Referring to FIG. 4, an enlarged cross-sectional view of a conductor line 36 is shown. Conductor line 36 has a conductive layer 36A or core of silver-platinum that is located on surface 12A. A first nickel strike layer 36B covers the conductive layer 36A. A second electroless nickel layer 36C covers layer 36B. Layer 36B and 36C form a barrier layer. An alloy layer 36D covers nickel layer 36C. Metal finger 22 is in frictional contact with layer 36D. Alloy layer 36D is preferably a nickel-gold alloy. Alloy layer 36D can also be formed from other alloys such as cobalt-gold, palladium-nickel, palladium-cobalt, platinum-cobalt, platinum-nickel, platinum-iridium, palladium-ruthenium and platinum-ruthenium. Examples of some possible alloys that could be used are shown in FIG. 6.

It is noted that each layer completely covers the layer below. It is further noted that FIG. 4 is not to scale. The thickness of plated layers 36 B, C and D is much less than the thickness of the thick film layer 36A. Each layer in FIG. 4 serves a particular purpose. For example, the thick film conductor layer 36A provides good adhesion to substrate 12 and has the cross-sectional area needed to conduct the required current. Nickel strike layer 36B seals the thick film layer 36A to prevent silver contamination of the plating bath used for nickel layer 36C. Electroless nickel layer 36C further seals layer 36B and provides a base with good adhesion for nickel-gold alloy layer 36D. The nickel-gold alloy layer 36D provides a corrosion resistant layer. Layer 36D also provides a hardened gold layer that has good mechanical wear resistance when wiper 25 slides across layer 36D during operation of the fuel sensor. Nickel-gold alloy layer 36D may be used in conjunction with a lubricant or a lubricant may be omitted.

The nickel-gold alloy layer 36D is preferably formed from Enthone Autronex plating bath that is commercially available from Enthone Corporation of West Haven, Conn. The nickel-gold alloy layer 36D has a preferred composition of 0.3 weight % to 4.0 weight % nickel and 96.0 weight % to 99.7 weight % gold based on total composition.

EXAMPLE 1

A resistor card was fabricated according to the present invention. An aluminum oxide substrate was used. Layers 36A, 36B, 36C and 36D were formed from the following materials:

Conductive layer 36A . . . 97.0 wt. % silver/1.0 wt. % platinum/2.0 wt. % glass.
First nickel strike layer 36B . . . 100 wt. % nickel.
Second electroless nickel layer 36C . . . 100 wt. % nickel.
Alloy layer 36D . . . 1.0 wt. % nickel/99.0 wt. % gold The resistor card of example 1 was tested for several performance parameters. The card was mated with a palladium alloy wiper and dry cycled for 1 million cycles. Visual inspection of the wear surfaces on the gold alloy showed very little wear of the alloy layer and none of the underlying nickel layer was exposed. The card was tested for noise performance. Noise performance was tested by cycling the wiper with a 5 volt applied voltage while measuring the output voltage. The resistor card of example 1 showed no noise spikes greater than 0.15 Volts after 1 million cycles. In comparison, a resistor card prepared with a palladium-silver thick film was tested for 660,000 cycles. Noise spikes greater than 0.7 Volts were present. A resistor card with pure gold plating was also tested for noise performance. After 1 million cycles, noise spikes of greater than 1.5 volts were present and some of the underlying nickel layer was exposed.

The resistor card was tested for surface roughness. The surface roughness was measured with a laser profilometer. The surface roughness for the nickel-gold alloy layer was 0.46 Ra. In comparison, the palladium-silver thick film had a larger value of surface roughness of 0.58.

Assembly Process

Figure 5:
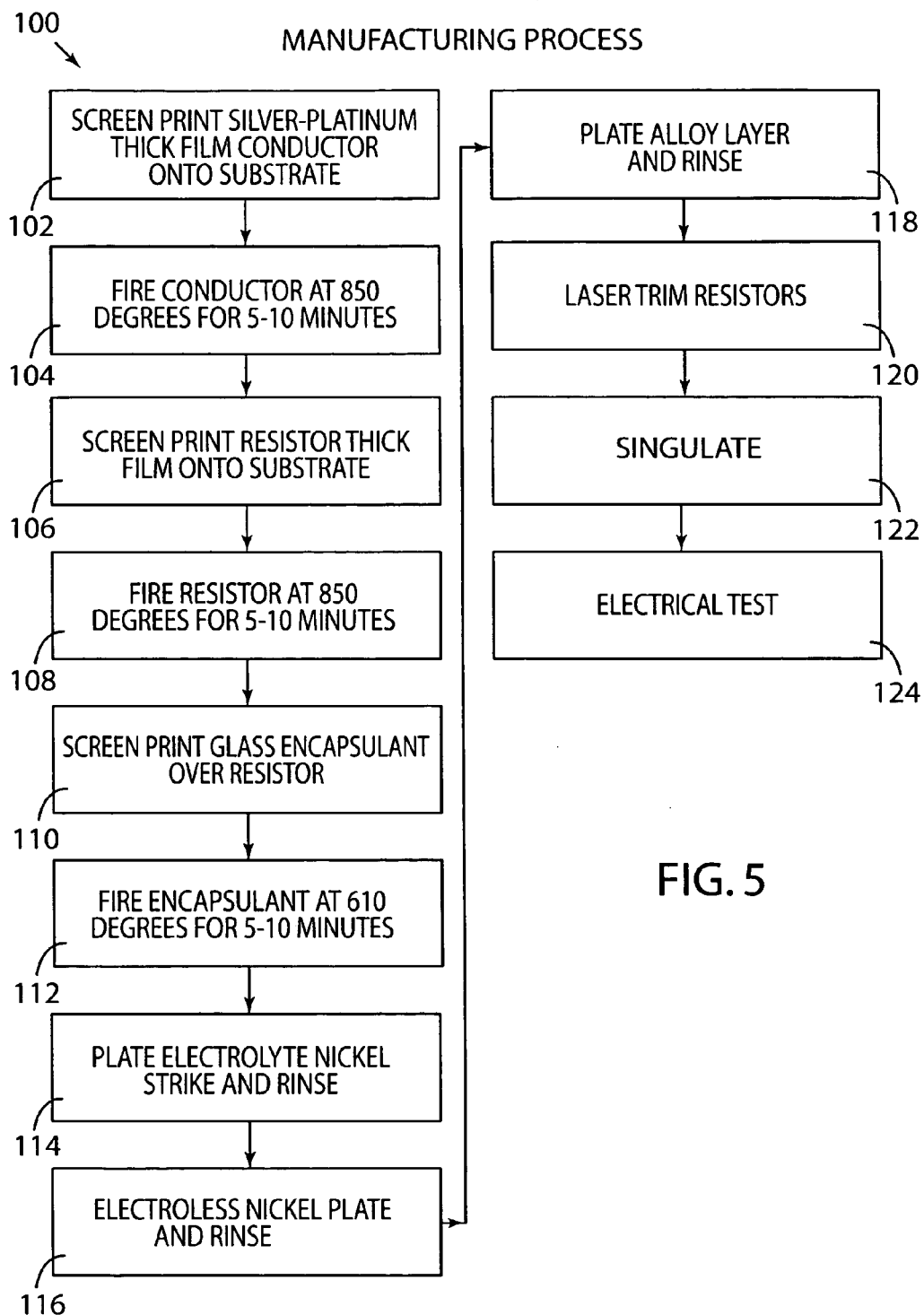
FIG. 5 is a flow chart of a process for manufacturing the resistor card of FIG. 1.

The process 100 for manufacturing resistor card 12 is shown in FIG. 5. At step 102, a platinum-silver thick film conductor having a metal ratio of 99 parts silver to 1 part platinum by weight such as Dupont 5426 is screen printed onto an aluminum oxide substrate to form the pattern of conductive lines, buss bars and terminals. The substrate can be a single resistor card or can be a multi-piece substrate that contains several resistor cards that are processed at the same time and then are separated later. Other thick film conductors can be used such as mixtures of palladium, silver and gold. The conductors are then fired at step 104 in a standard thick film furnace at 850 degrees centigrade for 5 to 10 minutes. Next, at step 106, a resistor thick film ink such as Dupont QS is screen printed onto the substrate to form the resistors. The resistors are then fired at step 108 in a standard thick film furnace at 850 degrees centigrade for 5 to 10 minutes. At step 110, a glass encapsulant such as Dupont 5415A is screen printed over the resistor 30 and 60. The encapsulant is then fired at step 112 in a standard thick film furnace at 610 degrees centigrade for 5 to 10 minutes. The encapsulant prevents the resistors from being electroplated during subsequent processing.

At step 114, an electrolytic nickel strike plate is deposited onto the conductors. The resistor card is placed into a plating bath of Enthone nickel sulfamate strike and plated for 2 minutes at 118 degrees F. and 20 amps per square foot. The card is then rinsed in de-ionized water after plating. The strike plate covers the silver thick film to prevent silver contamination in later plating baths. Next, at step 116, an electroless nickel plating is deposited over the electrolytic nickel. The resistor card is placed into a plating bath of Enthone Enplate 434 for 10 minutes at 190 degrees F. The resulting nickel plating has a thickness of 100–250 micro inches. The card is then rinsed in de-ionized water after plating. At step 118, the card is plated with a hard nickel-gold alloy. The resistor card is placed into a plating bath of Enthone Autronex (0.3% to 4% Ni) for 10 minutes at 92 degrees F. and 10 amps per square foot. The resulting nickel-gold plating has a thickness of 25–75 micro inches. The card is then rinsed in de-ionized water. At step 120, the resistor 60 is laser trimmed to adjust the overall resistance value. Buss bars 58 are also disconnected at this step from conductors 28 and resistor 30.

Next, the ceramic card is singulated into individual parts at step 122 then electrical tested and packaged at step 124.

Remarks

One of ordinary skill in the art of designing and using fuel level sensors will realize many advantages from using the present invention. The use of the nickel-gold plating prevents a silver rich thick film conductor from corrosion due to sulfur in the fuel. The nickel-gold plating being fairly thin in relation to the thick film conductor allows a much less costly solution to preventing corrosion in comparison to using a thick film that is composed of more noble metals such as gold, palladium and platinum. With the noble metals costing on the order of 100 times the cost of silver, the cost savings of not using these thick film conductors are quite significant.

An additional advantage of the present invention is reduced noise. The use of the nickel-gold plating prevents the formation of nonconductive materials such as Silver Sulfide (AgS). The non-conductive material changes the contact resistance that can appear as signal "noise" in the output of the ceramic resistor card.

The present invention does not have exposed silver that is available for interaction with sulfides in the fuel. It has very good oxidation and corrosion resistance and wear resistance. The present invention has low buss resistance and low contact resistance. The gold alloy plating allows for good solderability of wires to the terminals.

It is noted that the preferred embodiment used a glass encapsulant to prevent the resistor from being plating during the later plating operations. Other materials and processes could also be used. For example, a polymeric photoresist could be used that is imaged by photolithography or a screenable polymeric photoresist could be used.

It is noted that the preferred embodiment used a nickel-gold alloy as the outer most layer. Other plated alloys could also be used. FIG. 6 shows other alloys that could be used. For example, the following alloy compositions based on total weight percent composition could also be used:

1. 0.1 to 0.3% cobalt and 99.7 to 99.9% gold;
2. 15.0% to 25.0% nickel and 85.0% to 75.0% palladium;
3. 15.0% to 25.0% cobalt and 85.0% to 75.0% palladium.

The use of gold plating carries the concern of durability due to the high number of rotations required of a rheostat fuel sensor. Pure gold by itself is a very soft material. Pure gold has a hardness of 60–85 Knoop. As seen from FIG. 6, this is much less than the alloys shown. For example, the nickel-gold alloys shown have a hardness of 120–300 Knoop. The following table indicates the relative hardness of various materials with respect to that of a Palladium-Silver (Pd—Ag) thick film.

| | |
|---|---|
| Gold Plating | 25% of Pd-Ag hardness |
| Nickel-Gold Alloy Plating | 75% of Pd-Ag hardness |
| Platinum-Palladium-Gold Thick Film | 115% of Pd-Ag hardness |
| Palladium-Nickel Alloy Plating | 200% of Pd-Ag hardness |

The surface roughness and topography can also reduce durability of the sensor system by causing excessive wear of the wiper as it moves across the conductors. The hardened nickel-gold plating offers the following benefits;

The surface roughness of the thick film conductor is reduced by 20%.

The effects of the glass frit that are contained in thick film conductors are eliminated because the glass is no longer present on the surface.

The reduction in abrasion on the conductor surface results in less residue from contactor wear.

The nickel-gold plating fully covers the contacting surface.

The reduced surface roughness along with a 100% metallized surface allows for a greater selection of wiper materials. The lower abrasion characteristics of the nickel-gold plating can allow softer silver free contact materials to be used because higher contact gram force is no longer required to remove the tarnish between the wiper and the conductive traces.

The silver thick film conductor material of the present invention has 10 times greater conductivity than that of other noble metal thick film conductors. The lower sheet resistance will enable narrower and longer terminating traces while still meeting low-ohm buss resistance requirements. This will be particularly useful as rheostat designs get more complicated or utilize more of the ceramic real estate.

The present invention also greatly improves contact resistance. The Pd—Ag thick film conductors of the prior art have several problems. The thick film composition is a mixture of glass and Pd—Ag alloy powder. After high temperature firing, the surface of the conductor will have some glass exposure on the surface as well as oxidation of the metal alloy. Both of these components generate contact resistance. The nickel-gold plated conductors of the present invention are free of surface oxides. The lack of oxidation results in excellent electrical conductivity and low contact resistance.

The nickel-gold plated terminals are easily soldered. A burnishing step is not required to achieve solder coverage and wetting. The gold alloy plating allows for a long storage life prior to soldering.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A resistor card for a fuel level indicator system, comprising:

a planar ceramic substrate having a first and second surface;

an arc-shaped set of spaced apart conductor lines mounted on the first surface, the conductor lines each having a first end, a second end and a central portion;

an arc-shaped resistive area overlying the central portion, the resistive area in electrical contact with the electrical lines;

an encapsulant covering the arc-shaped resistive area;

an arc-shaped solid conductor—continuous—base mounted on the first surface and spaced from the conductor lines;

wherein a first nickel layer covers the conductor lines and the conductor base, wherein a second nickel layer covers the first nickel layer, and wherein an electroplated nickel and palladium alloy layer covers the second nickel layer, the nickel and palladium alloy layer having a composition based on a total composition comprising 15.0 to 25.0 weight percent nickel and 75.0 to 85.0 weight percent palladium.

2. The resistor card according to claim 1 wherein, the conductor lines and the conductor base have a composition based on total composition that is greater than 50 weight percent silver.

3. The resistor card according to claim 1 wherein, a buss bar is connected to the resistor area.

4. The resistor card according to claim 1 wherein, a buss bar is connected to the conductor base.

5. The resistor card according to claim 1 wherein, a terminal is connected to the resistor area.

6. The resistor card according to claim 1 wherein, a terminal is connected to the conductor base.

7. The resistor card according to claim 1 wherein, a second resistor is connected in series with the resistor area.

* * * * *